United States Patent
Kim et al.

(10) Patent No.: US 12,529,149 B2
(45) Date of Patent: Jan. 20, 2026

(54) SUBSTRATE PROCESSING APPARATUS AND SUBSTRATE PROCESSING METHOD

(71) Applicant: SEMES CO., LTD., Chungcheongnam-do (KR)

(72) Inventors: Min Jung Kim, Chungcheongnam-do (KR); Seong Soo Lee, Chungcheongnam-do (KR); Jun Kil Hwang, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 273 days.

(21) Appl. No.: 18/298,416

(22) Filed: Apr. 11, 2023

(65) Prior Publication Data

US 2023/0366100 A1 Nov. 16, 2023

(30) Foreign Application Priority Data

May 10, 2022 (KR) .......................... 10-2022-0056957

(51) Int. Cl.
*C23F 1/08* (2006.01)
*C23F 1/46* (2006.01)
(Continued)

(52) U.S. Cl.
CPC .................. *C23F 1/08* (2013.01); *C23F 1/46* (2013.01); *H01L 21/30604* (2013.01);
(Continued)

(58) Field of Classification Search
CPC ........ C23F 1/08; C23F 1/46; H01L 21/32134; H01L 21/68785; H01L 21/67017; H01L 21/6708; H01L 21/67253; H01L 21/30604
See application file for complete search history.

(56) References Cited

U.S. PATENT DOCUMENTS 6,357,457 B1 * 3/2002 Taniyama ................. B08B 3/02
134/198
2016/0042980 A1 2/2016 Ohashi
(Continued)

FOREIGN PATENT DOCUMENTS

CN 114127908 A * 3/2022 ....... H01L 21/67253
JP 2021-150381 A 9/2021
(Continued)

OTHER PUBLICATIONS

Korean Office Action issued in corresponding KR Patent Application No. 10-2022-0056957, dated Mar. 4, 2024, together with English translation.
(Continued)

Primary Examiner — Jeffrie R Lund
(74) Attorney, Agent, or Firm — Carter, DeLuca & Farrell LLP

(57) ABSTRACT

A substrate processing apparatus includes a substrate processing unit for processing a substrate by discharging a chemical liquid to the substrate; a chemical storage unit connected to the substrate processing unit by a chemical liquid supply line and a chemical liquid recovery line; and a liquid replenishment unit including an evaporation measurement member for measuring the amount of evaporation of water contained in the chemical liquid, and a water supply member for supplying water to the chemical liquid.

18 Claims, 11 Drawing Sheets

(51) Int. Cl.
  *H01L 21/306* (2006.01)
  *H01L 21/67* (2006.01)
  *H01L 21/3213* (2006.01)
  *H01L 21/687* (2006.01)

(52) U.S. Cl.
  CPC .... *H01L 21/67017* (2013.01); *H01L 21/6708* (2013.01); *H01L 21/67253* (2013.01); *H01L 21/32134* (2013.01); *H01L 21/68785* (2013.01)

(56) References Cited

U.S. PATENT DOCUMENTS

| | | | |
|---|---|---|---|
| 2016/0064259 A1* | 3/2016 | Kurusu | H01L 21/67028 |
| | | | 134/99.1 |
| 2019/0057890 A1* | 2/2019 | Sato | H01L 21/67265 |
| 2020/0016623 A1* | 1/2020 | Nanba | H01L 21/6715 |
| 2020/0135448 A1* | 4/2020 | Tanaka | B08B 3/10 |
| 2021/0296143 A1 | 9/2021 | Muraki et al. | |
| 2023/0366100 A1* | 11/2023 | Kim | H01L 21/6708 |

FOREIGN PATENT DOCUMENTS

| | | | |
|---|---|---|---|
| KR | 10-2012-0016954 A | 2/2012 | |
| KR | 10-2015-0119307 A | 10/2015 | |
| KR | 10-2020-0062327 A | 6/2020 | |
| WO | WO-2019208198 A1 * | 10/2019 | H01L 21/306 |
| WO | WO-2021015045 A1 * | 1/2021 | H01L 21/67253 |

OTHER PUBLICATIONS

Korean Office Action issued in corresponding KR Patent Application No. 10-2024-0199577, dated Aug. 22, 2025, with English translation.

\* cited by examiner

SUBSTRATE PROCESSING APPARATUS AND SUBSTRATE PROCESSING METHOD

CROSS-REFERENCE TO RELATED APPLICATIONS

The application claims benefit of priority to Korean Patent Application No. 10-2022-0056957 filed on May 10, 2022 in the Korean Intellectual Property Office, the disclosure of which is incorporated herein by reference in its entirety.

BACKGROUND

1. Field

Embodiments of the present disclosure relate to a substrate processing apparatus and a substrate processing method.

2. Description of Related Art

Generally, there may have been a replenishment system which corrects concentrations by feeding back a concentration of a chemical liquid by feeding back a concentration of the chemical liquid in a tank, whereas in the system which circulates a chemical liquid, a concentration of a recycled chemical liquid is not regularly managed.

In a chemical liquid recycling system, a storage unit for storing a chemical liquid to input the chemical liquid may include a condition tank, a main tank, and a recycling tank.

Here, to manage a concentration of a recycled chemical liquid, since a system which replenishes liquid by simply supplying water to the condition tank according to a certain period of time may have been used, water may not be retained in consideration of the amount of evaporated water according to a discharge time of the chemical liquid, such that there may have been a limitation in that it may be difficult to uniformly manage the concentration of the chemical liquid.

Specifically, as illustrated in FIG. 1, while a continuous substrate treatment process is performed, the etching rate may not be maintained uniformly and may gradually rise due to insufficient replenishment of water as water is replenished for a certain period of time. Also, although the water contained in the chemical liquid is not evaporated in a state in which the substrate treatment process is not performed (idle standby state), water may be continuously supplied, such that the concentration of the chemical liquid may continue to dilute over time.

SUMMARY

An embodiment of the present disclosure is to provide a substrate processing apparatus and a substrate processing method which may maintain a uniform concentration of a chemical liquid in a substrate processing system in which the chemical liquid is recovered.

According to an embodiment of the present disclosure, a substrate processing apparatus includes a substrate processing unit for processing a substrate by discharging a chemical liquid to the substrate; a chemical storage unit connected to the substrate processing unit by a chemical liquid supply line and a chemical liquid recovery line; and a liquid replenishment unit including an evaporation measurement member for measuring the amount of evaporation of water contained in the chemical liquid, and a water supply member for supplying water to the chemical liquid.

The evaporation measurement member may be a level sensor installed in a tank in which the chemical liquid is accommodated in the chemical storage unit.

The liquid replenishment unit may further include a control unit for automatically controlling the amount of water supply of the water supply member based on the amount of evaporation of water calculated through a water level measured by the level sensor.

The control unit automatically may control the amount of water supply of the water supply member based on the amount of evaporation of water and a decrease rate of concentration of the chemical liquid through a mechanism of an etching reaction of the substrate.

The water supply member may be connected to a nozzle portion for discharging the chemical liquid in the substrate processing unit. The water supply member may supply water to an upper surface of the substrate or to a lower surface of the substrate. The water supply member may be connected to the chemical liquid recovery line. The water supply member may be connected to the chemical liquid storage unit.

According to an embodiment of the present disclosure, a substrate processing apparatus includes a substrate processing unit including a processing vessel having a processing space in which a substrate is treated with a chemical liquid, a support unit supporting the substrate in the processing space, and a nozzle portion discharging the chemical liquid to the substrate in the processing space; a chemical storage unit including a recycling tank connected to the processing container through a chemical liquid recovery line, a condition tank connected to the recycling tank through a chemical liquid recycling line, and a main tank connected to the condition tank through a chemical liquid delivery line and connected to the nozzle portion through a chemical liquid supply line; and a liquid replenishment unit including an evaporation measurement member installed in the chemical liquid storage unit and measuring an amount of evaporation of water contained in the chemical liquid, and a water supply member supplying water to the chemical liquid, wherein the evaporation measurement member is a level sensor installed in the recycling tank, and the liquid replenishment unit further includes a control unit for automatically controlling the amount of water supply of the water supply member based on the amount of evaporation of water calculated through the water level measured by the level sensor.

According to an embodiment of the present disclosure, a substrate processing method includes a chemical liquid supplying step of supplying a chemical liquid to a nozzle portion; a substrate processing step of processing the substrate by discharging the chemical liquid to the substrate through the nozzle portion; a chemical liquid storage step of collecting the chemical liquid after processing the substrate and storing the chemical liquid; and a liquid replenishing step including a water supplying step of supplying water to the chemical liquid based on the amount of evaporation of water of the chemical liquid.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
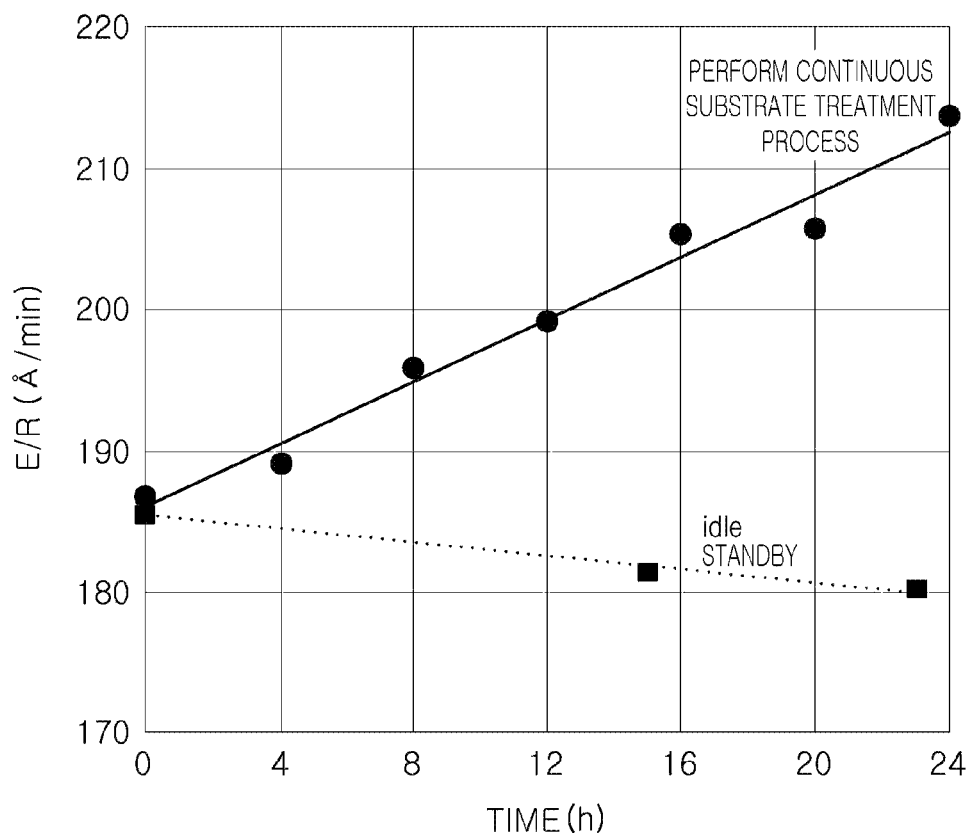
FIG. 1 is graphs illustrating an etching rate over time according to an embodiment of the present disclosure.

Hereinafter, embodiments of the present disclosure will be described as below with reference to the attached drawings.

In the drawings, same elements will be indicated by same reference numerals. Also, redundant descriptions and detailed descriptions of known functions and elements that may unnecessarily make the gist of the present disclosure obscure will be omitted. In the accompanying drawings, some elements may be exaggerated, omitted or briefly illustrated, and the sizes of the elements do not necessarily reflect the actual sizes of these elements. Also, the terms "upper," "upper portion," "upper surface," "lower," "lower portion," "lower surface," "side surface" are based on the drawings, and may be varied in a direction in which the components are disposed.

In the embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." The terms, "include," "comprise," "is configured to," or the like of the description are used to indicate the presence of features, numbers, steps, operations, elements, portions or combination thereof, and do not exclude the possibilities of combination or addition of one or more features, numbers, steps, operations, elements, portions or combination thereof.

Figure 2:
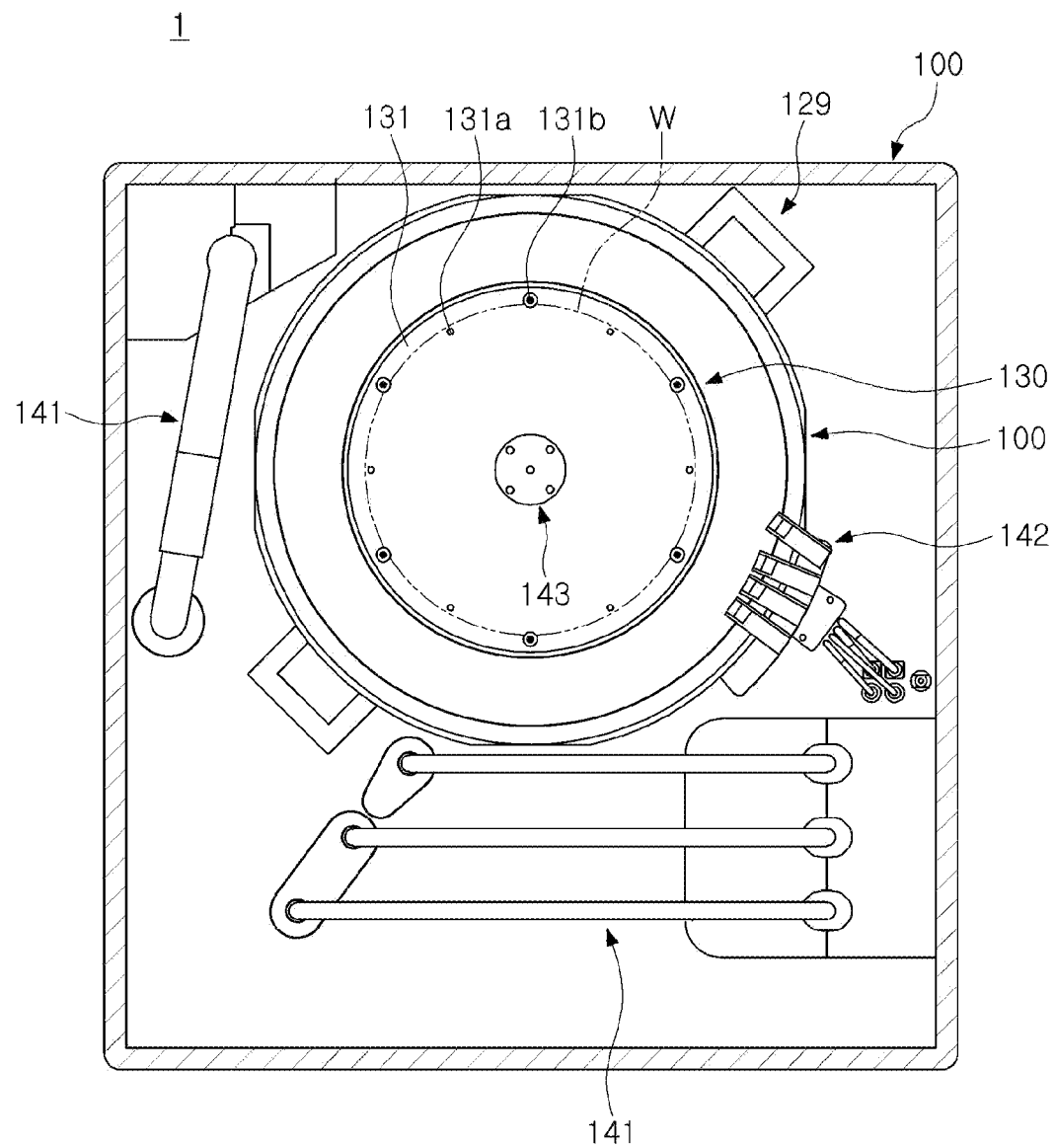
FIGS. 2 and 3 are diagrams illustrating a substrate processing unit according to an embodiment of the present disclosure.
Figure 3:
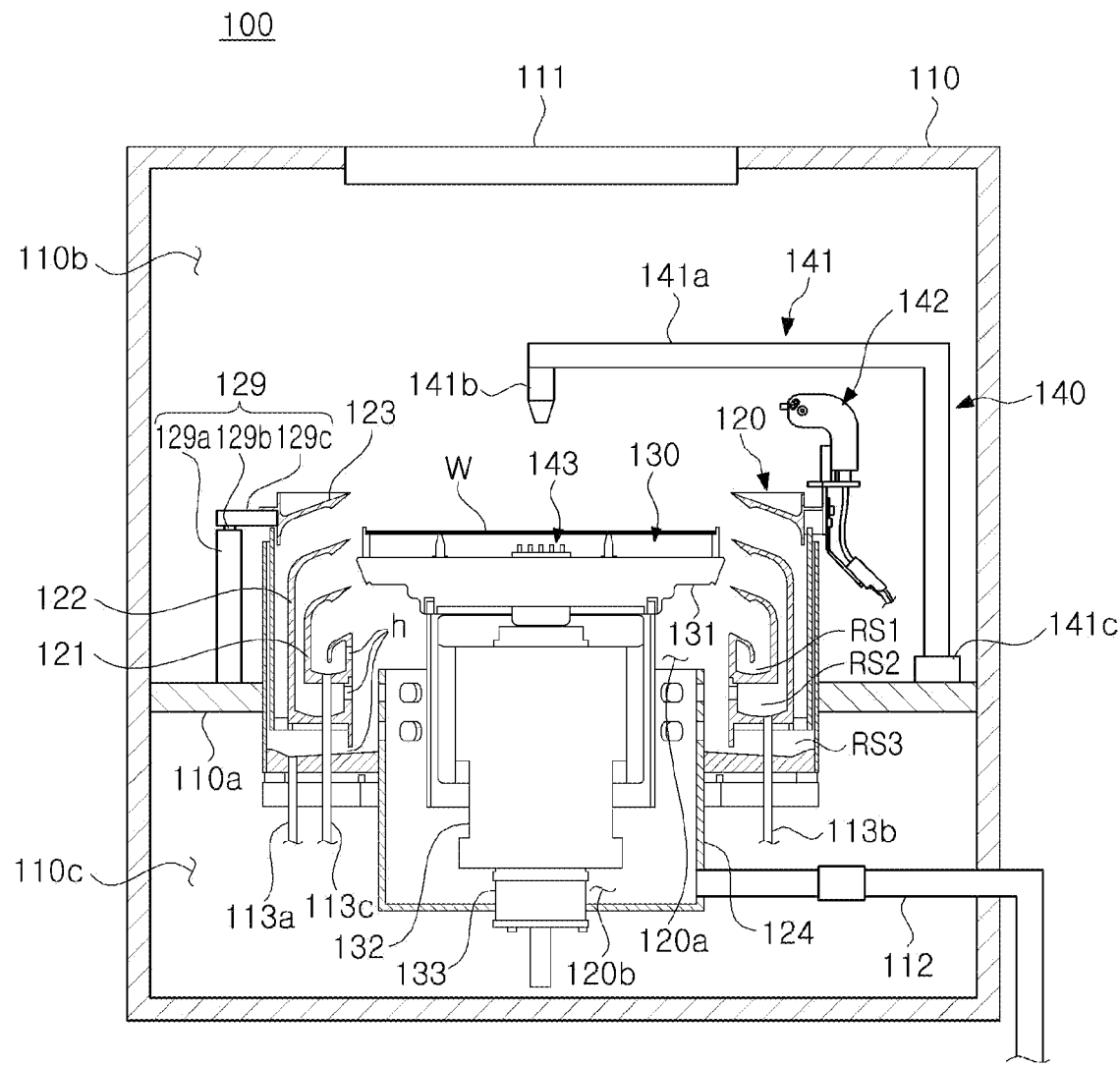

FIGS. 2 and 3 are diagrams illustrating a substrate processing unit according to an embodiment.

Referring to the drawings, the substrate processing unit 100 in the embodiment may include a process chamber 110 for performing a treatment process on a substrate W with a chemical liquid. In the process chamber 110, a treatment process may be performed on the substrate W while maintaining the substrate W horizontally. The treatment process may be an etching process of etching a film formed on the substrate W. In the case, the chemical liquid may include hydrogen peroxide. Further, the process chamber 110 may be used in a process of removing foreign substances and film materials remaining on the surface of the substrate W using various chemical liquids.

Specifically, the process chamber 110 may provide a sealed internal space, and a fan filter unit 111 may be installed in an upper portion. The fan filter unit 111 may generate vertical airflow in the process chamber 110. The fan filter unit 111 is a module of a filter and an air supply fan as a unit, and may filter clean air and may supply the air into in the process chamber 110. The clean air may pass through the fan filter unit 111, and may be supplied into the process chamber 110 and may form a vertical airflow. The vertical airflow may provide a uniform airflow above the substrate W, and may remove contaminants (fumes) generated in the process of treating the surface of the substrate W by the treatment fluid together with the air by discharging the contaminants through the suction ducts 21, 22, and 23 of the processing container 120, thereby maintaining high cleanliness in the processing container.

The process chamber 110 may include a process region 110b and a maintenance region 110c partitioned by a horizontal partition wall 110a. The driving member 129c of the lifting unit 129 and the driving member 143 of the nozzle portion 140 may be installed on the horizontal partition wall 110a. Also, the maintenance region 110c may be a space in which the discharge lines 113a, 113b, and 113c connected to the processing container 120 and an exhaust member 112 are disposed, and the maintenance region 110c may be isolated from the process region 110b in which the substrate W is processed.

The substrate processing unit 100 may include a processing container 120, a support unit 130, and a nozzle portion 140 in a process chamber 110. The processing vessel 120 may be installed in the process chamber 110, may have a cylindrical shape having an open upper portion, and may provide a processing space for processing the substrate W. The open upper surface of the processing container 120 may work as a path through the substrate W enters and is discharged. Here, the support portion 130 may be disposed in the processing space, and the support portion 130 may support the substrate W and may rotate the substrate W during the process.

Also, the processing vessel 120 may provide an upper space 120a in which the spin head 131 of the support 130 may be disposed, and a lower space 120b connected to an exhaust duct 124 to perform forced exhaust. The exhaust duct 124 may be connected to the exhaust member 112 extending to the outside of the process chamber 110. In the upper space 120a of the processing vessel 120, first, second, and third annular suction ducts 21, 22, and 23 through which as chemical liquid and gas scattered on the rotating substrate W enter and are discharged may be disposed in multiple stages. The first, second and third suction ducts 21, 22 and 23 may have exhaust ports h communicating with a common annular space (corresponding to the lower space of the processing container).

Here, the first, second, and third suction ducts 21, 22, and 23 may provide first to third recovery spaces RS1, RS2, and RS3 into which airflow containing chemical liquid and fume scattered from the substrate (W) flow. The first recovery space RS1 may be formed by being partitioned by the first suction duct 121, the second recovery space RS2 may be formed as a spacing between the first suction duct 121 and the second suction duct 122, and the third recovery space RS3 may be formed as a spacing between the second suction duct 122 and the third suction duct 123.

In addition to this, the processing vessel 120 may be coupled with a lifting unit 129 changing the vertical position of the processing vessel 120. The lifting unit 129 may linearly move the processing container 120 in the vertical direction. As the processing container 120 moves up and down, a relative level of the processing container 120 with respect to the spin head 131 may be changed. The lifting unit 129 may have a bracket 129a, a moving shaft 129b, and a driving member 129c. The bracket 129a may be fixedly installed on the outer wall of the processing container 120, and a moving shaft 129b moved vertically by a driving member 129c may be fixedly coupled to the bracket 129a. When the substrate W is loaded into or unloaded from the spin head 131, the processing chamber 120 may move down such that the spin head 131 may protrude upwardly from the processing chamber 120.

Also, when the process is performed, the level of the processing container 120 may be adjusted such that the chemical liquid may flow into the predetermined suction ducts 21, 22, and 23 depending on the type of the chemical liquid supplied to the substrate W. Accordingly, the relative vertical position between the processing container 120 and the substrate W may be changed. Accordingly, the processing vessel 120 may have different types of chemical liquid and pollutant gas recovered for the recovery space RS1, RS2, and RS3.

The support portion 130 may be installed on the inner side of the processing vessel 120. The support portion 130 may support the substrate W during the process and may rotate by the driving member 133 during the process. Also, the support portion 130 may have a spin head 131 having a circular upper surface. The upper surface of the spin head 131 may have a plurality of support pins 131a supporting the substrate W and a plurality of chucking pins 131b. A plurality of support pins 131a may be disposed on an upper edge of the spin head 131 with a constant distance therebetween and may be arranged in a predetermined arrangement, and may protrude upwardly from the spin head 131. The support pins 131a may support the lower surface of the substrate W such that the substrate W may be supported while being spaced apart from the spin head 131 in an upward direction. A plurality of chucking pins 131b may be disposed on an external side of the support pin 131a, respectively, and the chucking pins 131b may protrude upwardly. The plurality of chucking pins 131b may align the substrate W supported by the plurality of support pins 131a such that the substrate W may be disposed on the spin head 131 in a proper position. During the process, the plurality of chucking pins 131b may be in contact with the side portion of the substrate W and may prevent the substrate W from being separated from the original position. A support shaft 132 supporting the spin head 131 may be connected to the lower portion of the spin head 131, and the support shaft 132 may rotate by a driving member 133 connected to a lower end thereof. In the case, the driving member 133 may be provided as a motor, and as the support shaft 132 may rotate by the driving member 133, the spin head 131 and the substrate W may rotate.

The nozzle portion 140 may discharge the chemical liquid to the substrate W supported by the support unit 130. The nozzle portion 140 may include a moving nozzle 141 and a fixed nozzle 142. A plurality of moving nozzles 141 may be installed outside the processing container 120. The moving nozzle 141 may discharge a chemical liquid (acidic liquid, alkaline liquid, neutral liquid, and dry gas) for cleaning or etching the substrate W to the substrate W. Specifically, the moving nozzle 141 may include a nozzle arm 141a extending upwardly from the processing vessel 120, a nozzle tip 141b formed on an end of the nozzle arm 141a, and a driving member 141c mounted below the nozzle arm 141a, and may rotate and may move up and down by the driving member 141c. Also, a plurality of the fixed nozzles 142 may be installed above the processing container 120. The fixed nozzle 142 may spray the chemical liquid to the substrate W, and a spray angle may be adjusted according to the treatment position of the substrate W. The chemical liquid (treatment fluid) used in the substrate treatment process may be at least one selected from a group consisting of hydrofluoric acid (HF), sulfuric acid ($H_2SO_4$), hydrogen peroxide ($H_2O_2$), nitric acid ($HNO_3$), phosphoric acid ($H_3PO_4$), ozone water, and SC-1 liquid (a mixture of ammonium hydroxide ($NH_4OH$), hydrogen peroxide ($H_2O_2$) and water ($H_2O$)). Deionized water (DIW) may be used as the rinsing liquid, and isopropyl alcohol gas (IPA) may be used as the drying gas. In the case, the fixed nozzle 142 may spray the neutral chemical liquid to the substrate W. Also, the nozzle portion 140 may include a back nozzle 143 for spraying a chemical liquid to the lower surface of the substrate W.

Figure 4:
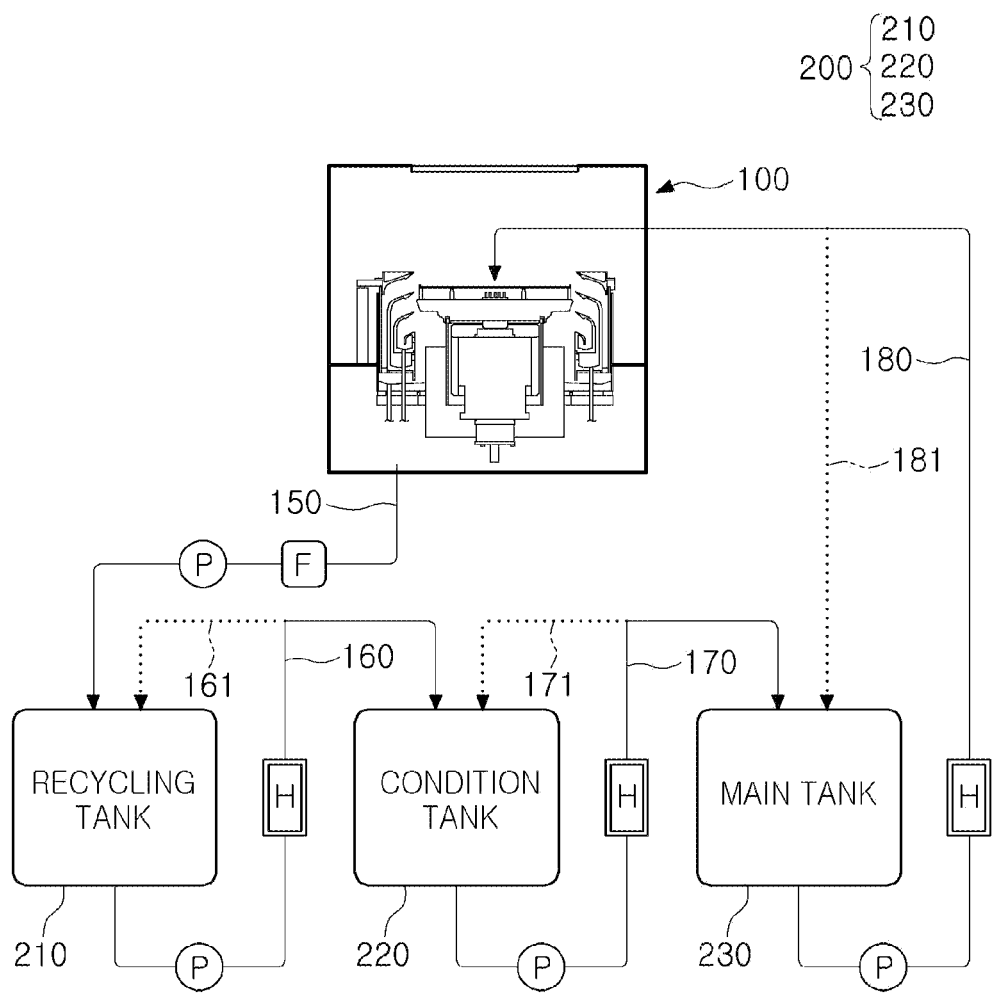
FIG. 4 is a diagram illustrating a substrate processing apparatus according to an embodiment of the present disclosure.

FIG. 4 is a diagram illustrating a substrate processing apparatus according to an embodiment.

Referring to the drawings, the substrate processing apparatus in the embodiment may include a substrate processing unit 100, a chemical liquid storage unit 200, and a liquid replenishment unit 300.

First, the substrate processing unit 100 may be a unit processing the substrate W by discharging a chemical liquid to the substrate W, and the detailed description thereof will not be repeated.

Also, the chemical storage unit 200 may be connected to the substrate processing unit 100 through a chemical supply line 180 and a chemical recovery line 150. Specifically, the chemical liquid storage unit 200 may include a recycling tank 210, a condition tank 220, and a main tank 230.

The recycling tank 210 may be a tank in which chemical liquids may be recovered from the processing container of the substrate processing unit 100. To the end, the recycling tank 210 may be connected to the processing container through the chemical liquid recovery line 150 in which the pump P may be installed. A filter F may be installed in the chemical liquid recovery line 150, may be used in the substrate treatment process and may filter the chemical liquid containing foreign substances to remove foreign substances. The recycling tank 210 may supply the chemical liquid to the condition tank 220 to recycle the chemical liquid. The recycling tank 210 may be connected to the condition tank 220 and the chemical liquid recycling line 160 in which the pump P may be installed. A heater H may be installed in the chemical liquid recycling line 160, and the first circulation line 161 connected to the recycling tank 210 may be branched. The chemical liquid may be heated before being supplied to the condition tank 220 by the heater H, and the temperature of the chemical liquid may be corrected while circulating through the first circulation line 161.

Also, the condition tank 220 may be a tank for receiving the chemical liquid from the recycling tank 210 and may transfer the chemical liquid to the main tank 230. To the end, the condition tank 220 may be connected to the main tank 230 through a chemical liquid delivery line 170 in which the pump P may be installed. A heater H may be installed in the chemical liquid delivery line 170, and the second circulation line 171 connected to the condition tank 220 may be branched. The chemical liquid may be heated before being supplied to the substrate processing unit 100 by the heater H, and the temperature of the chemical liquid may be corrected while circulating through the second circulation line 171.

The main tank 230 may be a tank for supplying a chemical liquid to the nozzle portion 140 of the substrate processing unit 100. To the end, the main tank 230 may be connected to the substrate processing unit 100 through the chemical liquid supply line 180 in which the pump P may be installed. A heater H may be installed in the chemical liquid supply line 180, and a third circulation line 181 connected to the main tank 230 may be branched. The chemical liquid may be heated before being supplied to the substrate processing unit 100 by the heater H, and the temperature of the chemical liquid may be corrected while circulating through the third circulation line 181.

Figure 5:
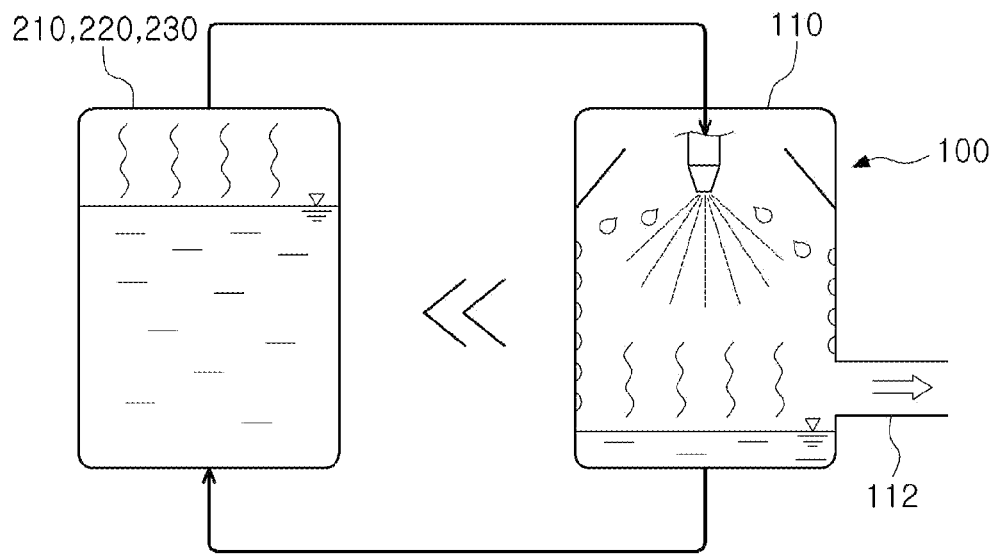
FIG. 5 is a diagram illustrating evaporation of water in a chemical liquid in a tank and a processing chamber of a substrate processing unit in the substrate processing apparatus in FIG. 3 according to an embodiment of the present disclosure.
Figure 6:
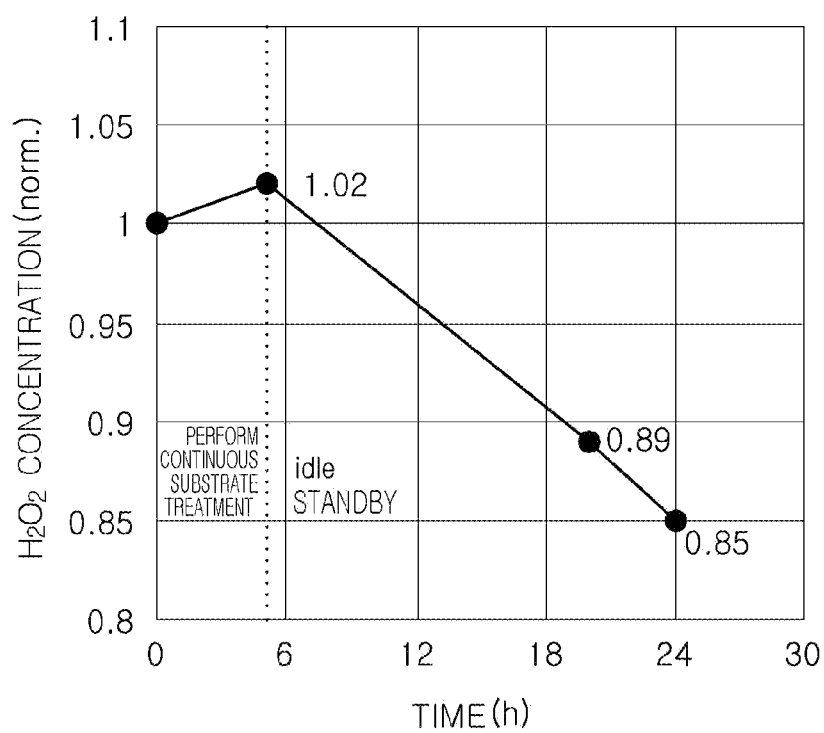
FIG. 6 is a graph illustrating a process of changing a concentration of hydrogen peroxide contained in an etchant according to an embodiment of the present disclosure.
Figure 7:
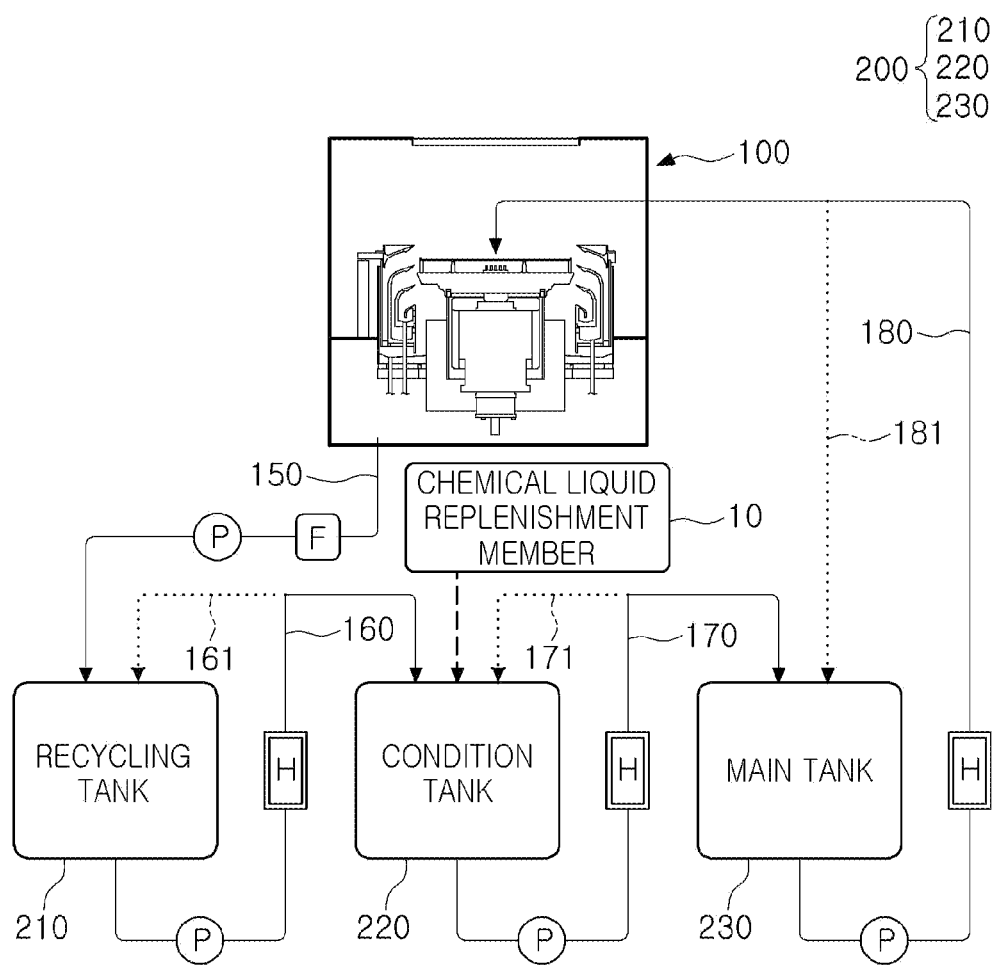
FIG. 7 is a diagram illustrating water is replenished in a condition tank in a substrate processing apparatus according to the prior art.

FIG. 5 is a diagram illustrating evaporation of water in a chemical liquid in a tank and a processing chamber of a substrate processing unit in the substrate processing apparatus in FIG. 3 according to an embodiment. FIG. 6 is a graph illustrating a process of changing a concentration of hydrogen peroxide contained in an etchant according to an embodiment. FIG. 7 is a diagram illustrating water is replenished in a condition tank in a substrate processing apparatus according to the prior art.

Referring to FIG. 5, in the substrate processing apparatus, in the tank (the recycle tank 210, condition tank 220, and main tank 230 in FIG. 3) in which the chemical liquid is stored and in the process chamber 110 in which the substrate W is processed by the chemical liquid in the substrate processing unit 100, water contained in the chemical liquid may evaporate over time. Water may be the easiest to evaporate because water may have the lowest boiling point in the chemical liquid. In the process chamber 110 of the substrate processing unit 100, the chemical liquid may be sprayed during the high-temperature treatment process and the chemical liquid may become small particles, such that the surface area may increase, and as the exhaust member 112 is also included, more water may evaporate in the process chamber 110 of the substrate processing unit 100 than in the tanks 210, 220, and 230 where the water is stored.

Therefore, as illustrated in FIG. 6, the concentration of hydrogen peroxide ($H_2O_2$), which is the main etchant contained in the chemical liquid, may continuously increase, such that a constant etching rate may not be obtained during the continuous process of recycling the chemical liquid (continuous etching process). In FIG. 6, it may be indicated that hydrogen peroxide liquid ($H_2O_2$) may increase by 2% as compared to the initial concentration when the continuous process is performed for about 6 hours. Accordingly, a concentration correction system based on evaporation of water may be necessary during recycling of the chemical liquid However, as illustrated in FIG. 7, in the substrate processing apparatus according to the prior art, the chemical liquid replenishment member 10 for simply supplying (supplementing) liquid or water to the condition tank 220 according to a predetermined time may be included. However, there may be a limitation in that the etching rate in the continuous etching process may not be uniform as water may not be replenished to the chemical liquid exactly as much as the amount of evaporation of water by the liquid replenishment according to the predetermined time by the chemical liquid replenishment member. For reference, the descriptions of the components described with reference to FIGS. 7 to 12 which may be the same as the components in FIGS. 2 to 4 have already been described with reference to FIGS. 2 to 4, and will thus not be repeated.

FIGS. 8 to 11 are diagrams illustrating a substrate processing apparatus according to various embodiments of the present disclosure.

Referring to the drawing, to overcome the above-mentioned limitations on etching rate non-uniformity due to evaporation of water, the substrate processing apparatus in the embodiment may include a substrate processing unit 100, a chemical storage unit 200, a liquid replenishment unit 300.

The liquid replenishment unit 300 may be configured to measure the amount of evaporation of water contained in the chemical liquid and may supply water to the chemical liquid based on the amount of evaporation. That is, the amount of evaporation of water included in the chemical liquid may be measured, and water may be supplied to the chemical liquid in an amount corresponding to the data based on the measured amount of evaporation as data.

Specifically, the liquid replenishment unit 300 may include an evaporation measurement member 310 and a water supply member 320.

The evaporation measurement member 310 may be installed in the chemical liquid storage unit 200 and may be configured to measure the amount of evaporation of water contained in the chemical liquid. As an example, the evaporation measurement member 310 may be a level sensor S installed in a tank in which the chemical liquid is accommodated in the chemical liquid storage unit 200. The level sensors S may be installed in each of the main tank 230, the recycling tank 210, and the condition tank 220 and may measure overall levels of the chemical liquid stored in each tank, such that the total amount of evaporation of water may be derived from the total chemical liquid stored in the overall tanks. In the case, as the level sensor S, a sensor which may accurately measure the level of the chemical liquid stored in the tank may be used, and any general sensor such as a laser method, ultrasonic method, and float method may be used.

The level sensor S configured as described above may perform a different role from a general level sensor as a component for measuring evaporation. A general level sensor may be simply used to sense a limit level (set level) of liquid contained in a container (tank) and may respond thereto. For example, a general level sensor may be used to sense the lowest level (lowest limit level) of liquid in a container and to replenish the same type of liquid as the liquid contained in the container, or may be used to sense the highest level (highest limit level) of liquid in the container and to replenish the same type of liquid. That is, a general level sensor may be used to maintain an appropriate level range of liquid in a container. Differently from the general level sensor, the level sensor S in the embodiment may be used to calculate the amount of evaporation of water contained in the chemical liquid. For example, evaporation of water may occur over time in an etchant containing hydrogen peroxide, and the level sensor S in the embodiment may calculate the amount of evaporation of water as a value. That is, as the level sensor in the embodiment is used to calculate the amount of evaporation of water contained in the chemical liquid rather than simply sensing the threshold level of the chemical liquid in the container, the level sensor in the embodiment may be different from general level sensors in terms of function and role.

Also, the water supply member 320 may supply water to the chemical liquid. Although not specifically illustrated, the water supply member 320 may include a water tank in which water is stored and a pump P for supplying water from the water tank. The water supply member 320 may replenish the water evaporated from the chemical liquid, and may supply water by an amount corresponding to the amount of water evaporated from the chemical liquid by the evaporation measurement member 310 based on the data. In the continuous treatment process for continuously processing the substrate (W in FIG. 3), the water supply member 320 may, for example, replenish water correspondingly based on the amount of evaporation of water obtained by the evaporation measurement member 310 in the existing continuous treatment process, and as another example, the water supply member 320 may replenish water correspondingly based on the amount of evaporation of water obtained by the evaporation measuring member 310 in real time in the continuous treatment process. In other words, as an embodiment, data of the amount of evaporation of water measured by the evaporation measurement member 310 may be obtained in advance by performing an experimental process for continuous treatment of the substrate W or a previous continuous treatment process, and in the actual continuous treatment process subsequently performed on the substrate W, water may be replenished with the water supply member 320 based on the data. In the case, the water supply (liquid replenishment) of the water supply member 320 may be performed by an operator (device manager) inputting the water replenishment amount into a process recipe based on the above data. Also, as another embodiment, while the amount of evaporation of water is measured in real time by the evaporation measurement member 310 during the actual continuous processing of the substrate W, water may be replenished with the water supply member 320 based on the measured data. In the case, the water supply (replenishment amount) of the water supply member 320 may be carried out by the control unit C deriving the amount of water supply (replenishment amount) in real time based on the data before the treatment process of the subsequent substrate W continuously supplied.

Thus, the supplementary unit 300 in the embodiment may further include a control unit C. The control unit C may automatically control the amount of water supply of the water supply member 320 based on the amount of evaporation of water calculated through the water level measured by the level sensor S. Specifically, the embodiment in which the supply of water by the water supply member 320 is not performed through automatic control may be performed based on the amount of evaporation of water derived based on the previously performed continuous treatment experimental process or the previously performed continuous treatment process. In contrast, the embodiment in which the water supply by the water supply member 320 is performed by the automatic control of the control unit C may be performed based on the amount of evaporation of water measured in real time during the continuous treatment process.

Further, the control unit C may automatically control the amount of water supply of the water supply member 320 based on the decrease rate of concentration of the chemical liquid due to the mechanism of etching reaction of the substrate W. That is, the control unit C may automatically control the amount of water supply of the water supply member 320 based on the above-mentioned amount of evaporation of water and based on the decrease rate of concentration of the hydrogen peroxide liquid simultaneously. Hydrogen peroxide ($H_2O_2$), a major etchant, may etch titanium (TiN) with the mechanism of etching reaction as below.

Step1: Ti or TiN+$H_2O_2$ or $HO_2^- \rightarrow TiO^{++}$ (Oxidation)
Step2: $TiO^{++}$+$H_2O_2$ or $HO_2^- \rightarrow TiO_{++} \cdot HO_2^-$, $TiO^{++} \cdot H_2O_2$ (highly soluble)

The concentration of the hydrogen peroxide liquid may be substantially lowered gradually by the mechanism of etching reaction, and the amount of water supply of the water supply member 320 may be automatically controlled (determined) based on the rate of decrease in the concentration of the hydrogen peroxide liquid. Accordingly, the control unit C may perform automatic control for calculating the water supply amount of the water supply member 320 based on both the data of the increase of concentration of the etchant due to the evaporation of water in real time in the continuous treatment process of the substrate W and the data of the decrease in the concentration of the etchant due to the etching reaction mechanism.

Figure 8:
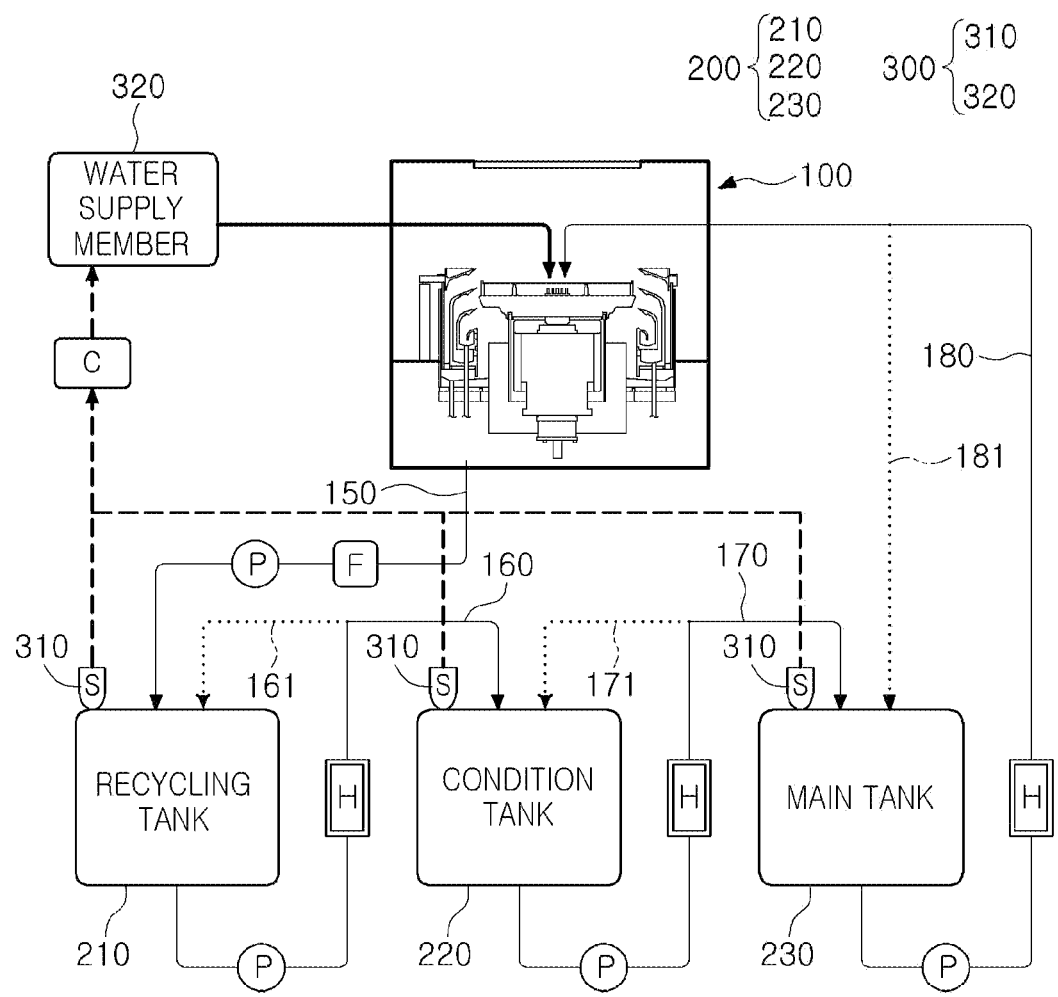
FIG. 8 is a diagram illustrating a substrate processing apparatus according to a first embodiment of the present disclosure.
Figure 9:
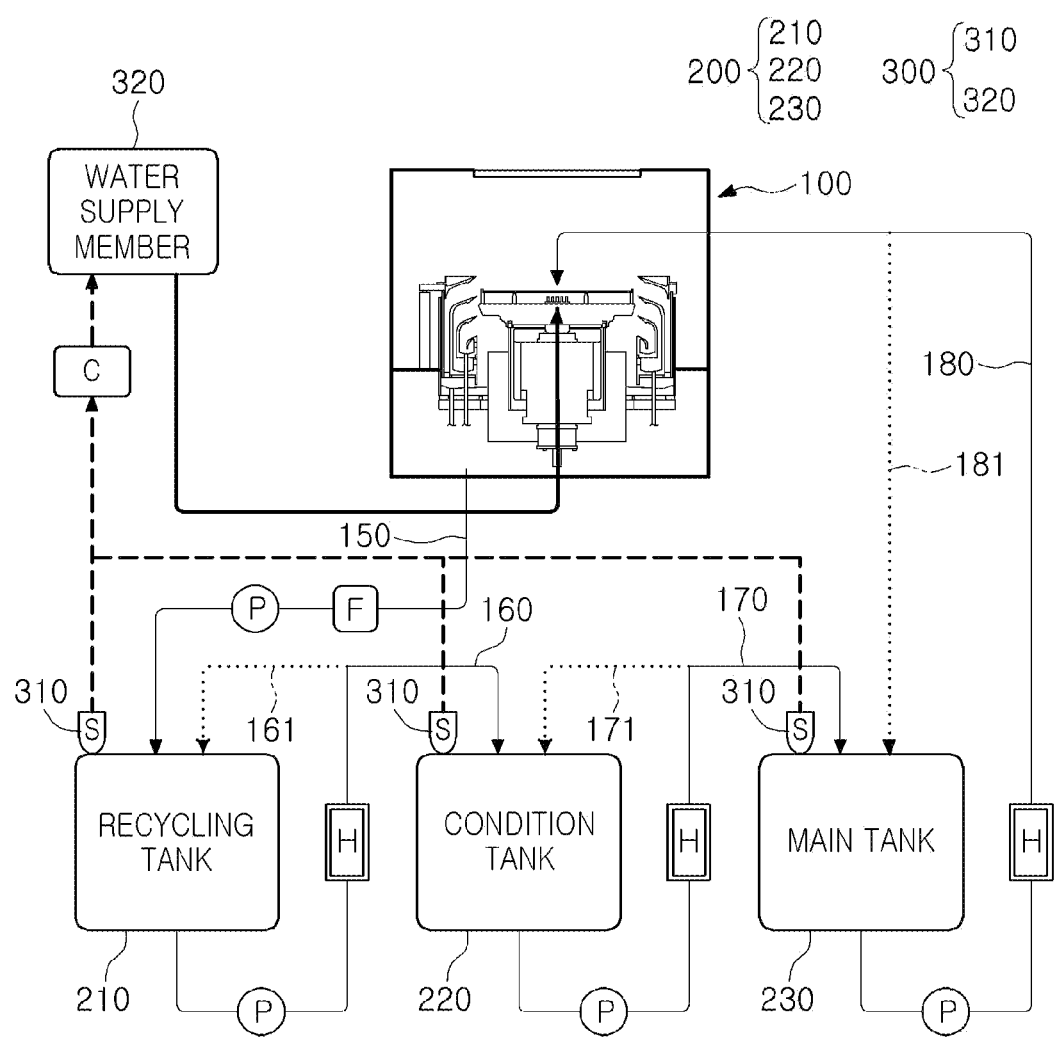
FIG. 9 is a diagram illustrating substrate processing apparatus according to a second embodiment of the present disclosure.

The water supply member 320 may be connected to a nozzle portion (140 in FIG. 3) for discharging a chemical liquid from the substrate processing unit 100 as illustrated in FIGS. 7 and 8 as the first and second embodiments. The water supply member 320 may supply water to the upper surface of the substrate (W in FIG. 3) or to the lower surface of the substrate. As an example, the water supply member 320 may discharge water to the upper or lower surface of the substrate W. In the case, the nozzle portion 140 may be at least one of an upper nozzle for discharging a chemical liquid to the upper surface of the substrate (W in FIG. 3) and a lower nozzle for discharging a chemical liquid to the lower surface of the substrate W. In the case, the chemical liquid may include an etching liquid, a cleaning liquid (water). That is, water may be discharged to the substrate W through a nozzle discharging an etchant among a plurality of upper nozzles of the nozzle portion 140 or may be discharged to the substrate W through a nozzle discharging a cleaning liquid. Also, water may be discharged to the substrate W through a nozzle discharging an etchant among a plurality of lower nozzles of the nozzle portion 140 or may be discharged to the substrate W through a nozzle discharging a cleaning liquid. Specifically, the water supply member 320 may be connected to an upper nozzle (not illustrated) as illustrated in FIG. 8 as a first embodiment. The upper nozzle may be configured to discharge a chemical liquid from the upper side of the substrate W to the upper surface of the substrate W, and may be the moving nozzle 141 or the fixed nozzle 142 illustrated in FIGS. 2 and 3. Also, the water supply member 320 may be connected to the lower nozzle as illustrated in FIG. 9 as a second embodiment. The lower nozzle may be configured to discharge a chemical liquid from the lower surface of the substrate W to the lower surface of the substrate W, and may be the back nozzle 143 illustrated in FIGS. 2 and 3. In the case, the supply of water to the nozzle portion 140 may be performed during a cleaning process before the etching process of the substrate W is completed or during a cleaning process after the completion of the etching process, and when the cleaning liquid is sprayed from the nozzle unit 140, water may be sprayed as much as the evaporation amount of water. Accordingly, the water supply member 320 may be connected to the nozzle portion 140, may supply water to the nozzle portion 140 and may spray the water by the nozzle portion 140, and by flowing into the recycling tank 210 through the chemical recovery line 150 of the substrate processing unit 100, water may be replenished with the chemical liquid.

Figure 10:
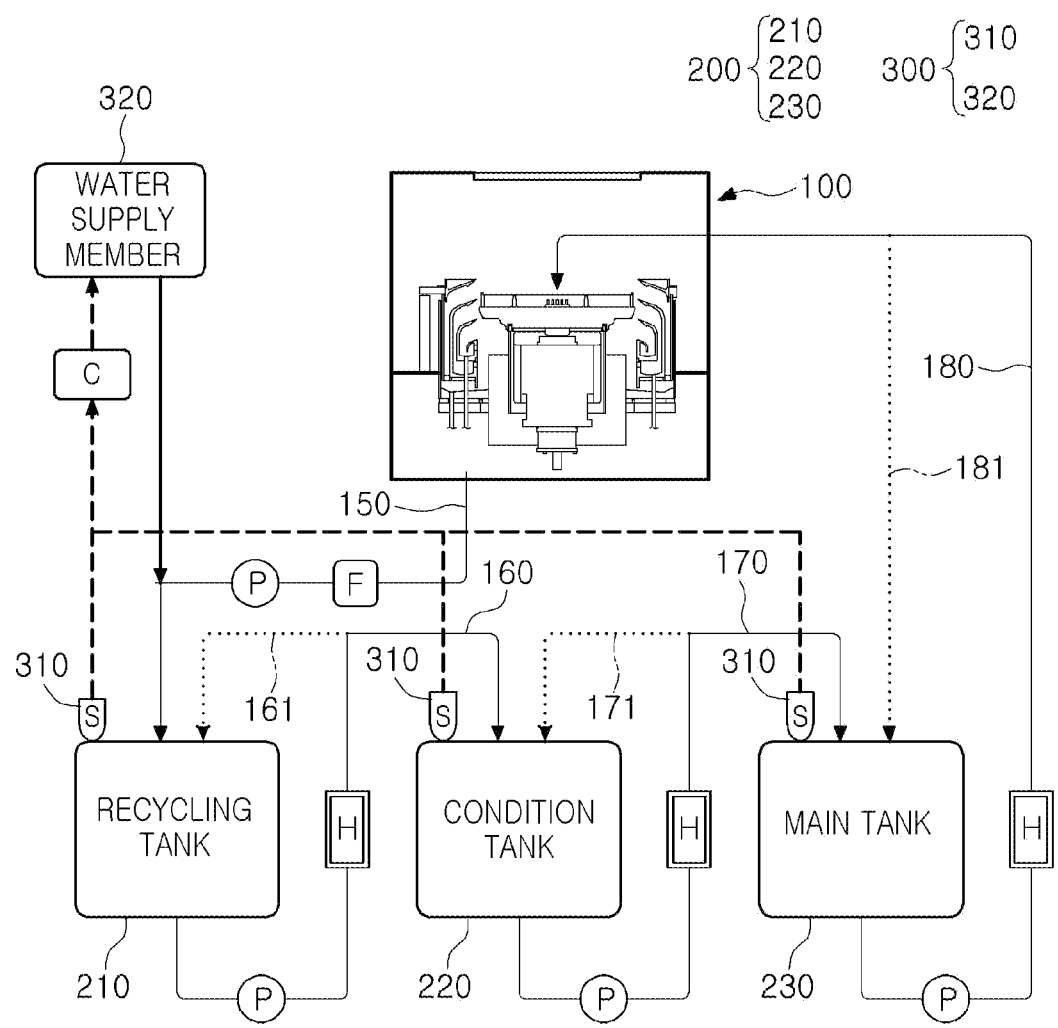
FIG. 10 is a diagram illustrating substrate processing apparatus according to a third embodiment of the present disclosure.
Figure 11:
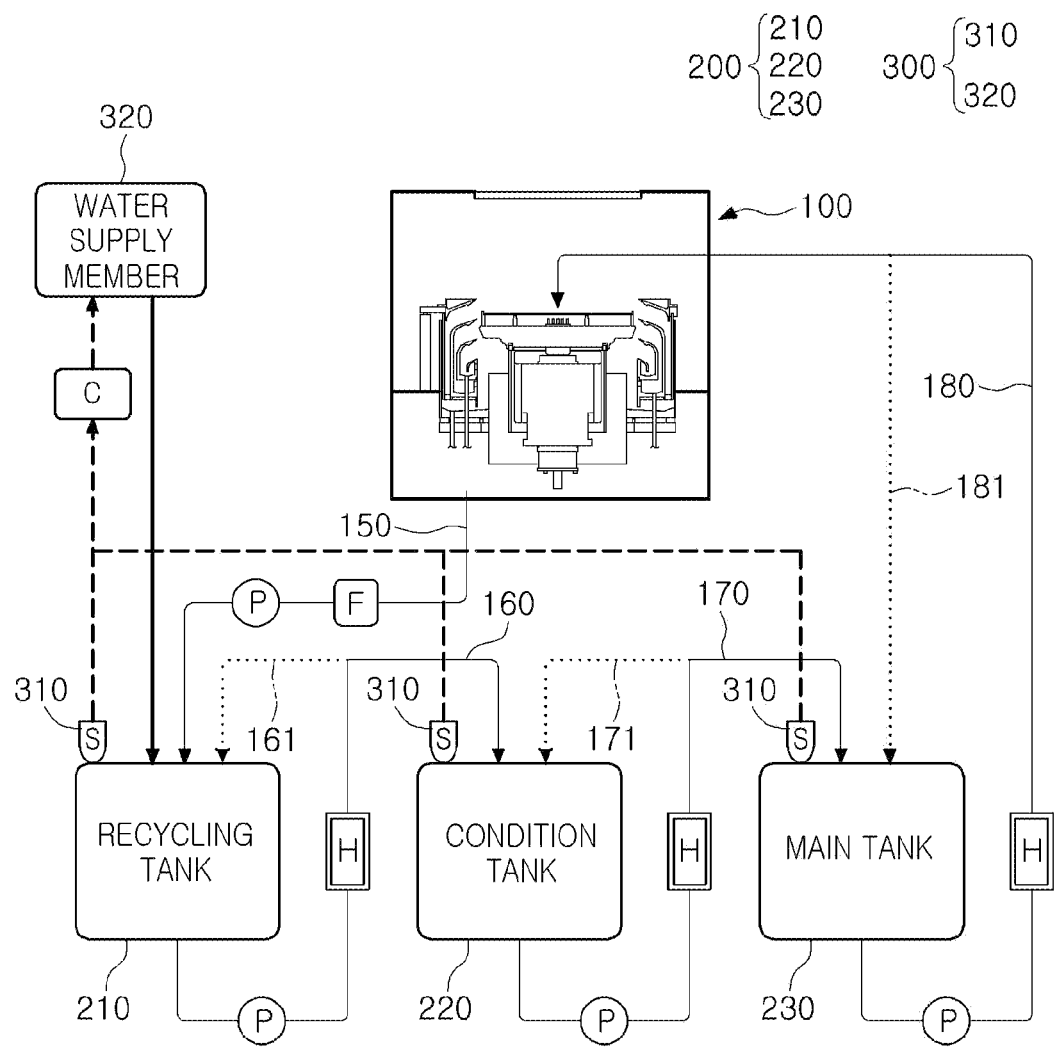
FIG. 11 is a diagram illustrating substrate processing apparatus according to a fourth embodiment of the present disclosure.

The water supply member 320 may be connected to the chemical liquid recovery line 150 as illustrated in FIG. 10 as a third embodiment. The chemical liquid recovery line 150 may be connected to the discharge lines (113*a*, 113*b*, 113*c* in FIG. 3) of the substrate processing unit 100, and may be paths through which the chemical liquid discharged from the substrate processing unit 100 to the substrate W may be recovered to the recycling tank 210. Also, the water supply member 320 may be connected to the chemical liquid storage unit 200 as illustrated in FIG. 11 as a fourth embodiment. The chemical liquid storage unit 200 may be at least one of the recycling tank 210, the condition tank 220, and the main tank 230. In the drawings, the water supply member 320 may be connected to the recycling tank 210, but an embodiment thereof is not limited thereto, and the water supply member 320 may be connected to the condition tank 220 or the main tank 230 as well. As such, the water supply member 320 may be connected to the chemical liquid recovery line 150 or the chemical storage unit 200 and may directly supply water to the chemical liquid, such that water may be replenished with the chemical liquid.

Figure 12:
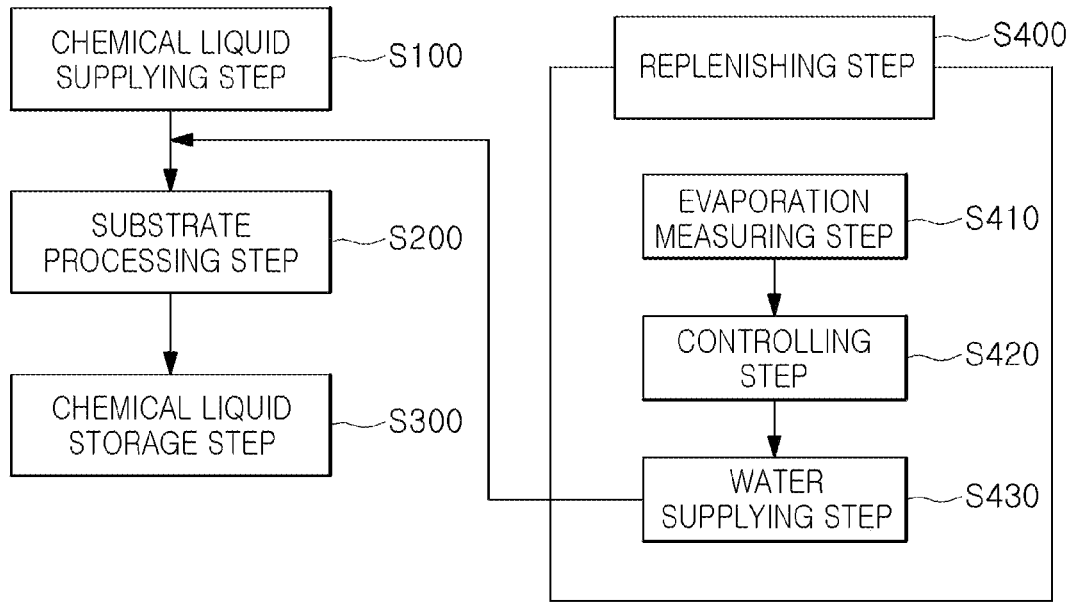
FIG. 12 is a diagram illustrating a substrate processing method according to an embodiment of the present disclosure.
Figure 13:
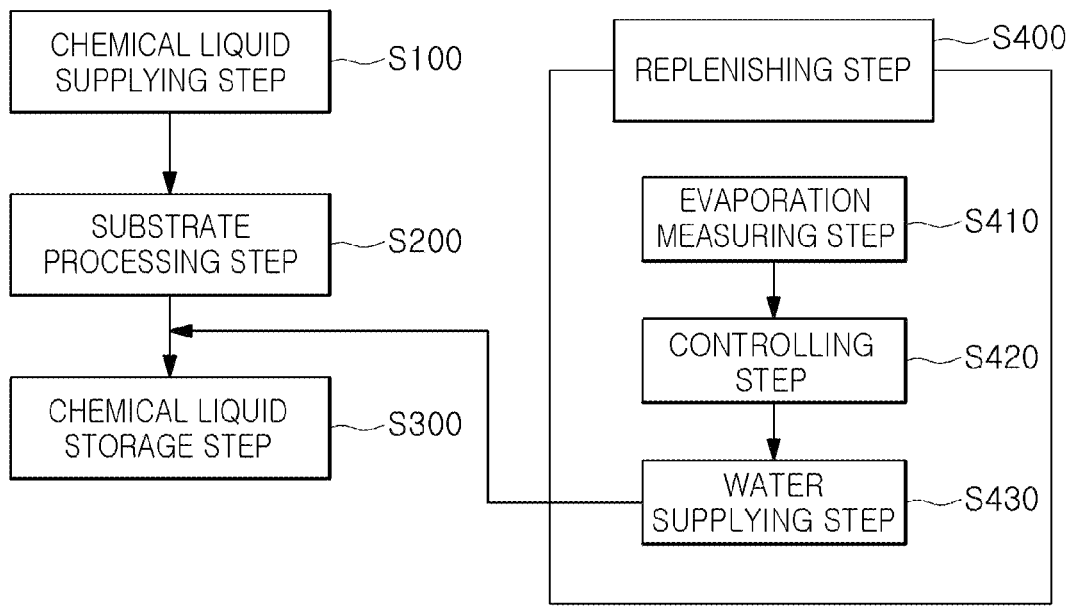
FIG. 13 is a diagram illustrating a substrate processing method according to another embodiment of the present disclosure.

FIG. 12 is a diagram illustrating a substrate processing method according to an embodiment. FIG. 13 is a diagram illustrating a substrate processing method according to another embodiment.

Referring to FIGS. 2 and 8 to 11 together with FIGS. 12 and 13, the substrate processing method in the embodiment may include a chemical liquid supplying step (S100), a substrate processing step (S200), a chemical liquid storage step (S300), and a replenishing step (S400).

First, the chemical liquid supplying step (S100) may be of supplying the chemical liquid to the nozzle portion 140, and the chemical liquid (etchant as an example) of the main tank 230 for substrate processing in the subsequent substrate processing step (S200) may be supplied to the nozzle portion 140 side of the substrate processing unit 100.

Subsequently, the substrate processing step (S200) may be of processing the substrate W by discharging a chemical liquid to the substrate W through the nozzle portion 140. As an example, an etching process for the substrate W may be performed by discharging an etchant to the substrate W through the nozzle portion 140.

Subsequently, the chemical storage step (S300) may be of recovering and storing the chemical liquid treated with the substrate W in the substrate processing step (S200). That is, in the chemical liquid storage step (S300), the chemical liquid may be recovered through the chemical liquid recovery line 150 of the substrate processing unit 100 and may be stored in the recycling tank 210, and the condition tank 220 and the main tank 230 subsequent to the recycling tank 210 may also store the chemical liquid.

And the embodiment may include a liquid replenishing step (S400), and the replenishing step (S400) may include an evaporation measuring step (S410) and a water supplying step (S430). The evaporation measuring step (S410) may be a process of measuring the amount of evaporation of water contained in the chemical liquid. Specifically, the amount of evaporation of water of the chemical liquid may be measured by the level change of the chemical liquid in the tank containing the chemical liquid in the chemical liquid storage step (S300). Further, the evaporation measuring step (S410) may be performed when the discharge time of the chemical liquid may be changed. During the substrate treatment process, the chemical discharge time may be determined differently for each type of substrate W, which causes the amount of evaporation of water to be different. Accordingly, in the evaporation measuring step (S410), the amount of evaporation of water may be measured for each type of substrate W.

Also, the water supplying step (S430) may be a process of supplying water to the chemical liquid based on the measured amount of evaporation of water of the chemical liquid. As an example, in the water supplying step (S430), water may be supplied to the upper surface of the substrate W or to the lower surface of the substrate W. As another example, in the water supplying step (S430), water may be supplied to the chemical liquid through the chemical liquid recovery line 150 or the chemical storage unit 200. That is, in the water supplying step (S430), water may be supplied to the chemical solution through the chemical liquid recovery line 150 for recovering the chemical liquid in the chemical storage step (S300), or through the chemical liquid storage unit 200 connected to the chemical liquid recovery line 150 and storing the chemical liquid. In the case, the water supplying step (S430) may be performed after or before the substrate processing step (S200). That is, when cleaning the substrate W after the substrate treatment (etching the substrate as an example) of the substrate treatment step (S200), water may be supplied to the chemical liquid through the nozzle portion 140, or when cleaning the substrate W before the substrate treatment in the substrate treatment step (S200), water may be supplied to the liquid chemical through the nozzle portion 140. Further, in the water supplying step (S430), water may be supplied to the chemical liquid through the chemical liquid recovery line 150 or the chemical liquid storage unit 200 before or after the substrate processing step (S200). Also, in the embodiment, when the substrate processing step (S200) is not performed, the supply of water to the chemical liquid may be blocked. As an example, when the high-temperature etching process is not performed, water evaporation may hardly occur, such that the supply (replenishment) of water to the chemical liquid may be blocked, and the substrate processing step (S200) is performed again and the system in which the chemical liquid is recovered is driven, water may be replenished as described above.

In the method (system) in the embodiment, the chemical supplying step (S100), the substrate processing step (S200), the chemical storage step (S300), and the liquid replenishing step (S400) may be cycled, and accordingly, in the continuous treatment process in which the continuously supplied substrate W is continuously treated, the chemical liquid may be recycled without wasting the chemical liquid.

Also, the replenishing step (S400) may further include a controlling step (S420). The controlling step (S420) may be a process of automatically controlling the amount of water supply of the water supply member 320 based on the amount of evaporation of water calculated through the water level measured by the evaporation measuring step (S410). Further, the control unit C may automatically control the amount of water supply of the water supply member 320 based on the decrease rate of concentration of the chemical liquid due to the mechanism of etching reaction of the substrate W along with the amount of evaporation of water.

According to an embodiment, the substrate processing apparatus and the substrate processing method may, by measuring the amount of evaporation of water contained in the chemical liquid in the chemical storage unit and supplying (liquid replacement) water to the chemical liquid based on the measured amount of evaporation, have the effect of maintaining the concentration of the chemical solution uniformly in the substrate processing system in which the chemical solution is recovered.

While the embodiments have been illustrated and described above, it will be apparent to those skilled in the art that modifications and variations could be made without departing from the scope of the present disclosure as defined by the appended claims.

What is claimed is:

1. A substrate processing apparatus, comprising:
a substrate processor for processing a substrate by discharging a chemical liquid to the substrate;
a chemical storer connected to the substrate processor by a chemical liquid supply line and a chemical liquid recovery line; and
a liquid replenishment unit including:
an evaporation measurement member for measuring the amount of evaporation of water contained in the chemical liquid,
a water supply member for supplying water to the chemical liquid; and
a controller for automatically controlling an amount of water supply of the water supply member based on the amount of evaporation of water calculated through a water level measured by the evaporation measurement member and based on a decrease rate of concentration of the chemical liquid through a mechanism of an etching reaction of the substrate.

2. The substrate processing apparatus of claim 1, wherein the evaporation measurement member is a level sensor installed in a tank in which the chemical liquid is accommodated in the chemical storer.

3. The substrate processing apparatus of claim 1, wherein the water supply member is connected to a nozzle portion for discharging the chemical liquid in the substrate processor.

4. The substrate processing apparatus of claim 3, wherein the water supply member supplies water to an upper surface of the substrate or to a lower surface of the substrate.

5. The substrate processing apparatus of claim 3, wherein the nozzle portion includes a moving nozzle and a fixed nozzle.

6. The substrate processing apparatus of claim 5, wherein the moving nozzle is configured for discharging the chemical liquid onto the substrate and the fixed nozzle is configured for discharging a neutral chemical liquid onto the substrate.

7. The substrate processing apparatus of claim 1, wherein the water supply member is connected to the chemical liquid recovery line.

8. The substrate processing apparatus of claim 1, wherein the water supply member is connected to the chemical storer.

9. The substrate processing apparatus of claim 1, wherein the substrate processor further includes:
a processing vessel having a processing space in which the substrate is treated with the chemical liquid,
a lifter configured to change a vertical position of the processing vessel, and
a duct fluidly coupled to a recovery space,
wherein the lifter is configured to move the processing vessel such that pollutants scattered from the substrate are caused to flow into the duct and be contained within the recovery space.

10. A substrate processing apparatus, comprising:
a substrate processing unit including a processing vessel having a processing space in which a substrate is treated with a chemical liquid, a support unit supporting the substrate in the processing space, and a nozzle portion discharging the chemical liquid to the substrate in the processing space;
a chemical storage unit including a recycling tank connected to the processing container through a chemical liquid recovery line, a condition tank connected to the recycling tank through a chemical liquid recycling line, and a main tank connected to the condition tank through a chemical liquid delivery line and connected to the nozzle portion through a chemical liquid supply line; and
a liquid replenishment unit including an evaporation measurement member installed in the chemical liquid storage unit and measuring an amount of evaporation of water contained in the chemical liquid, and a water supply member supplying water to the chemical liquid,
wherein the evaporation measurement member is a level sensor installed in the recycling tank, and
wherein the liquid replenishment unit further includes a controller for automatically controlling the amount of water supply of the water supply member based on the amount of evaporation of water calculated through the water level measured by the level sensor and based on a decrease rate of concentration of the chemical liquid through a mechanism of an etching reaction of the substrate.

11. The substrate processing apparatus of claim 10, wherein the evaporation measurement member further includes a level sensor installed in each of the main tank and the condition tank.

12. The substrate processing apparatus of claim 10, wherein the nozzle portion includes an upper nozzle for discharging the chemical liquid to an upper surface of the substrate and a lower nozzle for discharging the chemical liquid to a lower surface of the substrate, and wherein the water supply member is connected to at least one of the upper nozzle and the lower nozzle.

13. A substrate processing method, comprising:
supplying a chemical liquid to a nozzle portion;
processing the substrate by discharging the chemical liquid to the substrate through the nozzle portion;
collecting the chemical liquid after processing the substrate and storing the chemical liquid; and
replenishing and supplying water to the chemical liquid based on an amount of evaporation of water of the chemical liquid,
wherein the replenishing includes automatically controlling an amount of water supplied in the supplying based on the amount of evaporation of water calculated through a water level measured and based on a decrease rate of concentration of the chemical liquid by a mechanism of etching reaction of the substrate together with the amount of evaporation of water.

14. The substrate processing method of claim 13, wherein the supplying, the processing, the collecting, and the replenishing are cycled.

15. The substrate processing method of claim 13, wherein the replenishing includes measuring the amount of evaporation of water contained in the chemical liquid before the supplying.

16. The substrate processing method of claim 15, wherein the measuring includes measuring the amount of evaporation of water of the chemical liquid as a level change of the chemical liquid in the tank containing the chemical liquid in the chemical liquid storage step.

17. The substrate processing method of claim 15, wherein the measuring is performed when a discharge time of the chemical liquid is changed.

18. The substrate processing method of claim 13, wherein the supplying includes supplying water to an upper surface of the substrate or to a lower surface of the substrate.

* * * * *